United States Patent
Brandle, Jr. et al.

[11] Patent Number: 4,698,820
[45] Date of Patent: Oct. 6, 1987

[54] MAGNETIC DEVICE AND METHOD OF MANUFACTURE

[75] Inventors: Charles D. Brandle, Jr., Basking Ridge; Vincent J. Fratello; Raymond Wolfe, both of New Providence, all of N.J.

[73] Assignee: American Telephone and Telegraph Company, AT&T Bell Laboratories, Murray Hill, N.J.

[21] Appl. No.: 858,396

[22] Filed: May 1, 1986

[51] Int. Cl.$^4$ ............................................. H01S 3/16
[52] U.S. Cl. .................................. 372/41; 252/62.57
[58] Field of Search ............. 372/41; 252/62.51, 62.57

[56] References Cited

U.S. PATENT DOCUMENTS

| 4,002,975 | 1/1977 | Erickson et al. ...................... 324/96 |
| 4,202,930 | 5/1980 | Kokta et al. ....................... 252/62.57 |

OTHER PUBLICATIONS

"The Development of Magneto-Optical Research in Garnets and Magnetic Insulators", *Ferrites: Proceedings of the International Conference*, J. F. Dillon, 1980, pp. 743-749.

"Magneto-Optics and Its Uses", *Journal of Magnetism and Magnetic Materials*, J. F. Dillon, vol. 31-34, 1983, pp. 1-9.

"Magneto-Optic Properties and Applications of Bismuth-Substituted Iron Garnets", *IEEE Transactions on Magnetics*, G. B. Scott et al., vol. MAG-12, 1976, pp. 292-311.

"Magneto-Optic Properties of Rare-Earth Iron Garnet Crystals in the Wavelength Range 1.1-1.7 Micrometer and Their Use in Device Fabrication", *Journal of Physics D*, R. C. Booth et al., vol. 17, 1984, pp. 579-587.

"Magneto-Optical Properties of Magnetic Garnets", *Physics of Magnetic Garnets*, J. F. Dillon, Societa Italiana di Fisica, 1978, p. 399, Table I.

"Magnetic and Crystallographic Study of Neodymium-Substituted Yttrium and Gadolinium Iron Garnets", *Physical Review*, S. Geller et al., vol. 123, 1961, pp. 1692-1699.

"Crystal-Chemical Study of the Rare-Earth Iron Garnets", *Journal of Chemical Physics*, G. P. Epinosa, vol. 37, 1962, pp. 2344-2347.

"On the Incorporation of Neodymium Mixed Yttrium-Neodymium-Iron Garnets", *Journal of Applied Physics*, G. Goldring et al., vol. 31, 1960, pp. 2057-2059.

*Primary Examiner*—Leon Scott, Jr.
*Attorney, Agent, or Firm*—Peter A. Businger

[57] ABSTRACT

Crystals of neodymium and praseodymium iron garnet materials have Faraday rotation which render such materials suitable for use, e.g., as antireciprocal components in optical devices and communications systems. These materials can be made by liquid-phase epitaxy on a substrate having suitable lattice parameters, deposition being carried out at relatively low melt temperatures.

15 Claims, 1 Drawing Figure

MAGNETIC DEVICE AND METHOD OF MANUFACTURE

The Government has rights in this invention pursuant to Contract No.AF33615-81-C-1404 awarded by the Department of the Air Force.

TECHNICAL FIELD

The invention is concerned with magnetic devices and their manufacture.

BACKGROUND OF THE INVENTION

The class of magnetic devices encompasses, e.g., magnetic domain or "bubble" devices; encompassed also are magneto-optic devices as described, e.g., by J. F. Dillon, "The Development of Magneto-optical Research in Garnets and Magnetic Insulators", *FERRITES: Proceedings of the International Conference*, 1980, pp. 743–749; and by J. F. Dillon, "Magneto-optics and Its Uses", *Journal of Magnetism and Magnetic Materials*, Vol. 31–34 (1983), pp. 1–9.

Magneto-optic devices have been receiving increasing attention in connection with optical communications systems which typically include sources, modulators, and detectors of electromagnetic radiation having a specified desired wavelength, and which may further include optical waveguide transmission lines, switches, deflectors, and optical isolators, the latter being intended for preventing spurious reflected light from re-entering a light source. A well-established design for optical isolators is based on Faraday rotation of polarized electromagnetic radiation as mentioned in the above-cited papers and as further described and illustrated by G. B. Scott et al., "Magneto-optic Properties and Applications of Bismuth-substituted Iron Garnet", *IEEE Transactions on Magnetics*, Vol. MAG-12 (1976), pp. 292–311; and by R. C. Booth et al., "Magneto-optic Properties of Rare-earth Iron Garnet Crystals in the Wavelength range 1.1–1.7 micrometer and Their Use in Device Fabrication", *Journal of Physics D*, Vol. 17 (1984), pp. 579–587.

The latter paper, in particular, is concerned with the magneto-optic properties of a number of single-crystal materials which are classified as rare-earth iron garnets and which incorporate rare-earth elements yttrium, gadolinium, terbium, dysprosium, holmium, erbium, or ytterbium. Faraday rotation data for these and other rare-earth iron garnets, actual and hypothetical, are given by J. F. Dillon, "Magneto-optical Properties of Magnetic Garnets", *Physics of Magnetic Garnets*, Societa Italiana di Fisica, 1978; see especially page 399, Table I.

With respect to garnet manufacture it was believed that no unsubstituted rare-earth garnet could form with a lattice parameter greater than 1.2540 nanometer; in this respect see S. Geller et al., "Magnetic and Crystallographic Study of Neodymium-substituted Yttrium and Gadolinium Iron Garnets", *Physical Review*, Vol. 123 (1961), pp. 1692–1699; and G. P. Espinosa, "Crystal-Chemical Study of the Rare-Earth Iron Garnets", *Journal of Chemical Physics*, Vol. 37 (1962), pp 2344–2347.

Also, magnetic garnets had been made comprising neodymium or praseodymium in amounts not higher than amounts incorporated in respective compounds $(Nd_2Y)Fe_5O_{12}$ and $(Pr_{1.8}Y_{1.2})Fe_5O_{12}$. In this respect, see G. Goldring et al., "On the Incorporation of Neodymium in Mixed Yttrium-Neodymium-Iron Garnets", *Journal of Applied Physics*, Vol. 31, (1960), pp. 2057–2059; and P. Hansen et al., *Journal of Applied Physics*, to appear.

SUMMARY OF THE INVENTION

Single-crystals of neodymium and praseodymium iron garnet materials can be made, e.g., by liquid-phase epitaxial deposition. These materials are suitable for use in magnetic and, especially, in magneto-optic devices such as, e.g., optical isolators in optical communications systems.

BRIEF DESCRIPTION OF THE DRAWING

The FIGURE schematically shows a laser light source device comprising an optical isolator.

DETAILED DESCRIPTION

Figure 1:
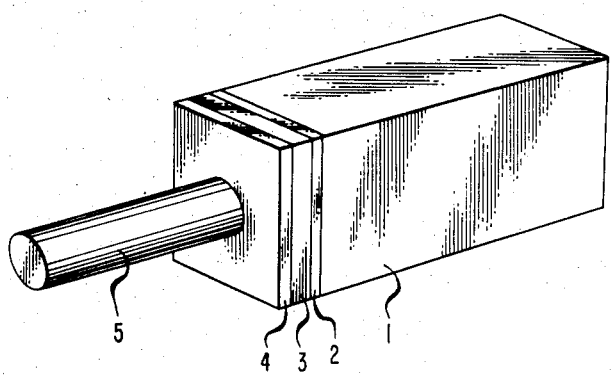

Shown in the FIGURE is laser 1, linear polarizer 2, polarization-rotating body 3, linear polarizer 4, and optical waveguide 5; not shown is a magnetic field source such as, e.g., a permanent magnet for magnetically biasing the magnetic body 3 in a direction parallel or antiparallel to the direction of light propagation.

Thickness of the polarization-rotating body 3 is chosen to produce a 45-degree rotation of polarization of linearly polarized radiation passing through the body. The direction of polarization of polarizer 4 is turned by the same 45 degrees relative to the direction of polarization of polarizer 2, allowing for free passage of radiation coming from laser 1 via polarizer 2 and polarization-rotating body 3.

As described, the depicted arrangement provides for light emanating from laser 1 to enter waveguide 5. Conversely, the arrangement serves to prevent any extraneous radiation traveling in the opposite direction from reaching laser 1. Such extraneous radiation may originate upon partial reflection of laser radiation at the optical fiber interface; also, extraneous radiation may originate elsewhere in an optical system connected to waveguide 5.

In the case of laser light reflected at the optical fiber interface, reflected light passing back through body 3 is rotated an additional 45 degrees, this on account of the antireciprocal nature of the magneto-optic effect in body 3. Rotated light is now linearly polarized perpendicular to the polarization direction of polarizer 2 and thus prevented from entering laser 1. In this case, namely for laser light reflected from the optical fiber interface, the presence of polarizer 4 is not essential.

In the case of light originating elsewhere, polarizer 4 serves to linearly polarize such light, body 3 turns the polarization of polarized light perpendicular to the polarization direction of polarizer 2 and, again, light is prevented from reaching laser 1.

In accordance with the invention, a device such as, e.g., an optically isolated laser as described above comprises a body of neodymium, praseodymium, or neodymium-praseodymium iron garnet material; for example, in the device described above, such material is chosen for the realization of body 3. More generally, on account of high values of magneto-optic rotation (Faraday rotation), neodymium, praseodymium, and neodymium-praseodymium iron garnet material is useful in devices such as, e.g., magneto-optic switches, displays, memories, isolators, modulators, and light deflectors. Devices in accordance with the invention may include a source of polarized optical radiation; also, devices may include an optical polarizer.

While neodymium and praseodymium iron garnet materials are considered to be particularly suited for use where magneto-optic effects are involved, their use in other types of magnetic devices is not precluded; in particular, their use in magnetic bubble devices is contemplated.

Material Composition

Neodymium and praseodymium iron garnet material of the invention may be essentially as represented by the formulas $Nd_3Fe_5O_{12}$ and $Pr_3Fe_5O_{12}$; more generally, neodymium and praseodymium may be included in combination, and there may be other substituents in the rare-earth (dodecahedral) as well as in the iron (octahedral and tetrahedral) sites of the garnet crystallographic structure. More specifically, garnet material of the invention may be essentially as represented by the formula $$Nd_xPr_yR_{3-x-y}T_zFe_{5-z}O_{12},$$

where either $x+y$ is greater than 2 or else y is greater than 1.8, where R stands for one or several rare-earth site substituents such as, e.g., Y, Ca, Bi, Pb, La, Ce, Sm, Eu, Gd, Tb, Dy, Ho, Er, Lu, Tm, or Yb, and where T stands for one or several iron site substituents such as, e.g., Al, Ga, Ge, Si, Pb, Pt, or V.

Material Manufacture

Neodymium, praseodymium and neodymium-praseodymium iron garnet material of the invention can be made by liquid-phase epitaxial deposition, first by heteroepitaxy on a suitable substrate such as, e.g., samarium scandium-gallium garnet and, once a bulk seed is available, by homoepitaxy on such seed. Conveniently, epitaxial deposition is from a melt including garnet constituent oxides and a flux component. Choice of the latter is not critical; among suitable flux constituents are lead oxide and boron oxide, lead oxide and vanadium oxide, barium oxide, bismuth oxide, sodium hydroxide, and potassium hydroxide.

In the interest of minimizing homogeneous nucleation of orthoferrite, undercooling is limited so as to favor heterogeneous growth of garnet. And, in the interest of thermodynamic stability of growing garnet material, growth temperature is maintained relatively low as compared with customary practice of rare-earth garnet growth. More specifically, preferred growth temperature is less than or equal to 1050 degrees C. and preferably less than or equal to 950 degrees C., this as contrasted with customary conditions of growth at temperatures exceeding 1100 degrees C.

When a $PbC-B_2O_3$ is used, growth temperatures greater than or equal to 750 degrees C. are preferred. Also, it will be realized in this case that growth at preferred temperatures results in the inclusion of a certain amount of lead in dodecahedral as well as in octahedral sites and, possibly, of platinum in octahedral sites. Such inclusions tend to raise optical absorption and to lower the Curie temperature of a magnetic garnet material; however, these effects are considered as tolerable.

Deposition is on a substrate having lattice parameters which are compatible with those of a crystal being grown; for example, lattice constants are preferred in the range of from 1.256 to 1.263 nanometer and preferably from 1.2586 to 1.2606 nanometer for growth of neodymium iron garnet. Similarly, for growth of praseodymium iron garnet, preferred substrate lattice constants are in a range of from 1.261 to 1.268 nanometer and preferably from 1.2636 to 1.2656 nanometer. (Too large a mismatch may lead to excessive stress in a grown layer or may prevent a desired crystal material from growing altogether. A highly stressed crystal layer may crack upon cooling from deposition temperature.)

The following examples illustrate the manufacture of neodymium and praseodymium iron garnet materials and provide data concerning their crystallographic, magnetic, and magneto-optic properties. Considered as particularly noteworthy are the measured values of magneto-optic rotation, this especially as compared with the much weaker corresponding effect in the standard magnetic garnet material, yttrium-iron garnet (YIG), $Y_3Fe_5O_{12}$.

EXAMPLE 1

(Neodymium Iron Garnet)

A substrate was cut from a body of samarium scandium-gallium garnet, $Sm_3(Sc_{1.8}Ga_{3.2})O_{12}$ which had been grown by the Czochralski technique. The substrate had a lattice parameter, $a_0$, of approximately 1.2617 nanometer as determined by X-ray diffraction.

A melt was prepared comprising a standard PbO—$B_2O_3$ flux and garnet constituents; specific oxides were used in the following approximate amounts: 0.647 weight percent (0.396 mole percent) neodymium oxide, $Nd_2O_3$, 12.289 weight percent (15.840 mole percent) iron oxide, $Fe_2O_3$, 1.706 weight percent (5.043 mole percent) boron trioxide, $B_2O_3$, and 85.358 weight percent (78.721 mole percent) lead oxide, PbO.

The substrate was immersed in the melt while melt temperature was held at approximately 890 degrees C. (corresponding to undercooling of approximately 10 degrees C.), and a film of neodymium iron garnet having a thickness of approximately 0.5 millimeter was deposited on the substrate over a period of approximately 48 hours. Due to stress caused by film-substrate lattice mismatch, the deposited layer cracked and broke upon withdrawal from the melt. A broken-off piece was then used as a seed for further deposition, and a sample was grown by homoepitaxy measuring approximately 2 by 2 by 2 millimeters.

The lattice parameter, $a_0$, of the sample was approximately 1.2596 nanometer, and magnetic properties were determined as follows: A vibrating sample magnetometer was used to measure a Curie temperature, $T_c$, of approximately 294 degrees C. and a room-temperature magnetization, $4\rho M_s$, of approximately 2080 oersteds. The quantity $K_1/M_s$ (where $M_s$ is as defined with respect to room-temperature magnetization and where $K_1$ is the cubic anisotropy) and the gyromagnetic ratio, $\gamma$, were measured at a temperature of approximately 25 degrees C. on small spheres by ferromagnetic resonance spectra taken at multiple orientations. From such measurement, $K_1$ was determined as approximately equal to $-180000$ erg/cm$^3$, and $\gamma$ was found to be approximately equal to 3.35 megahertz/oersted. Magneto-optical rotation was measured at room temperature using light having wavelengths in the range of from 0.5 to 2.5 micrometers as produced by a monochromator. A rotating polarizer technique was used, and a field of approximately 2000 oersteds was applied to saturate the sample. For respective representative wavelengths of approximately 1.064, 1.3, and 1.55 micrometer, measured rotations were approximately −1130, −690, and −420 degrees/cm. Such values of magneto-optic rotation are contrasted with respective values for yttrium-iron garnet of approximately +280, +206, and +160 degrees/cm.

Finally, absorption measurements showed the material to be highly transparent at wavelengths greater than approximately 1 micrometer.

EXAMPLE 2

(Praseodymium Iron Garnet)

A substrate was cut from a body of samarium scandium-gallium garnet, $Sm_3(Sc_2Ga_3)O_{12}$ which had been grown by the Czochralski technique. The substrate had a lattice parameter, $a_0$, of approximately 1.2640 nanometer as determined by X-ray diffraction.

A melt was prepared comprising a standard $PbO-B_2O_3$ flux and garnet constituents; specific oxides were used in the following approximate amounts: 0.655 weight percent (0.396 mole percent) praseodymium oxide, $Pr_6O_{11}$, 12.298 weight percent (15.852 mole percent) iron oxide, $Fe_2O_3$, 1.705 weight percent (5.042 mole percent) boron trioxide, $B_2O_3$, and 85.342 weight percent (78.710 mole percent) lead oxide, PbO.

The substrate was immersed in the melt while melt temperature was held at approximately 865 degrees C. (corresponding to undercooling of approximately 10 degrees C.), and a film of praseodymium iron garnet having a thickness of approximately 0.5 millimeter was deposited on the substrate in the course of approximately 48 hours. The deposited layer cracked and broke upon withdrawal from the melt. A broken-off piece was then used as a substrate for further deposition, and a sample was grown by homoepitaxy measuring approximately 6 by 5 by 2 millimeters.

The lattice parameter, $a_0$, of the sample was approximately 1.2646 nanometer, and magnetic properties were determined by the same methods as described in Example 1 above. The following values were obtained: A Curie temperature, $T_c$, of approximately 296 degrees C., a room-temperature magnetization, $4\rho M_s$, of approximately 2065 oersteds, a cubic anisotropy, $K_1$, of approximately 40000 erg/cm³, a gyromagnetic ratio, $\gamma$, of approximately 3.27 megahertz/oersted. For representative wavelengths of approximately 1.064, 1.3, and 1.55 micrometer, respective magneto-optical rotation was approximately −1789, −1060, and −799 degrees/cm.

Absorption measurements showed the material to have absorption peaks at wavelengths of approximately 1.5 and 1.875 micrometer and to be highly transparent at wavelengths beyond approximately 2.4 micrometers.

What is claimed is:

1. A device comprising a body of magnetic material, characterized in that said body consists essentially of a garnet material as represented by the formula:

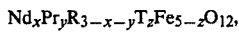

$Nd_xPr_yR_{3-x-y}T_zFe_{5-z}O_{12}$, where either x+y has a value which is greater than 2 or else y has a value which is greater than 1.8, where R stands for at least one rare-earth crystallographic site substituent, where T stands for at least one iron crystallographic site substituent, and where z is greater than or equal to zero.

2. The device of claim 1, the value of x+y being greater than 2.
3. The device of claim 1, the value of y being greater than 1.8.
4. The device of claim 1, the value of x+y being essentially equal to 3.
5. The device of claim 1, R being selected from the group consisting of Y, Ca, Bi, Pb, La, Ce, Sm, Eu, Gd, Tb, Dy, Ho, Er, Lu, Tm, and Yb.
6. The device of claim 1, T being selected from the group consisting of Al, Ga, Ge, Si, Pb, Pt, and V.
7. The device of claim 1, said device comprising said body as a body of magneto-optic material.
8. The device of claim 7, said device further including an optical polarizer.
9. The device of claim 7, said device further including a source of polarized optical radiation.
10. The device of claim 7, said device further including a laser light source.
11. A method for making a magnetic device having a body which consists essentially of a garnet material represented by the formula:

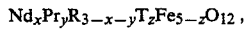

$Nd_xPr_yR_{3-x-y}T_zFe_{5-z}O_{12}$, said method comprising
bringing a surface of a substrate in contact with a melt which comprises constituents of said garnet material and which further comprises at least one flux constituent, the temperature of said melt being less than or equal to 1050 degrees C.

12. The method of claim 11 in which said substrate consists essentially of samarium scandium-gallium garnet.
13. The method of claim 11 in which the material of said substrate is selected from the group consisting of neodymium iron garnet, praseodymium iron garnet, and neodymium-praseodymium iron garnet.
14. The method of claim 11 in which said melt comprises flux constituents lead oxide and boron oxide.
15. The method of claim 14 in which the temperature of said melt is greater than or equal to 750 degrees C.

* * * * *